US012125760B2

(12) United States Patent
Wen

(10) Patent No.: US 12,125,760 B2
(45) Date of Patent: Oct. 22, 2024

(54) METHOD FOR FABRICATING ELECTRONIC PACKAGE STRUCTURE

(71) Applicant: RichWave Technology Corp., Taipei (TW)

(72) Inventor: Yu-Lung Wen, Kaohsiung (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 18/113,062

(22) Filed: Feb. 23, 2023

(65) Prior Publication Data

US 2023/0197548 A1    Jun. 22, 2023

Related U.S. Application Data

(62) Division of application No. 17/199,371, filed on Mar. 11, 2021, now Pat. No. 11,615,997.

(30) Foreign Application Priority Data

Jul. 28, 2020 (TW) .................................. 109125388

(51) Int. Cl.
*H01L 23/31* (2006.01)
*H01L 23/00* (2006.01)

(52) U.S. Cl.
CPC .......... *H01L 23/3121* (2013.01); *H01L 24/16* (2013.01); *H01L 24/26* (2013.01); *H01L 24/81* (2013.01); *H01L 2224/16227* (2013.01); *H01L 2224/26145* (2013.01); *H01L 2224/81815* (2013.01)

(58) Field of Classification Search
None
See application file for complete search history.

(56) References Cited

U.S. PATENT DOCUMENTS

| 2018/0233423 A1* | 8/2018 | Lobianco | H01L 24/13 |
| 2020/0105712 A1* | 4/2020 | Hsieh | H01L 24/33 |
| 2023/0091131 A1* | 3/2023 | Kim | H01L 23/3735 |
| | | | 257/690 |
| 2023/0197548 A1* | 6/2023 | Wen | H01L 23/3121 |
| | | | 257/668 |

FOREIGN PATENT DOCUMENTS

| TW | 201618626 A | 5/2016 |
| TW | 202013644 A | 4/2020 |

* cited by examiner

*Primary Examiner* — Long Pham
(74) *Attorney, Agent, or Firm* — Winston Hsu

(57) ABSTRACT

A method of manufacturing an electronic package structure is disclosed. A solder mask layer is formed on an upper surface of a substrate. A recessed area is formed in the solder mask layer. An electronic component is mounted on the substrate. Pads are disposed on the upper surface of the substrate. The pads respectively correspond to the bumps on a first surface of the electronic component. The pads are electrically connected to the bumps. A heat treatment is performed to make the first surface close to the substrate and form a cavity in the recessed area. The cavity is between the first surface of the electronic component, the solder mask layer and the upper surface of the substrate.

7 Claims, 8 Drawing Sheets

METHOD FOR FABRICATING ELECTRONIC PACKAGE STRUCTURE

CROSS REFERENCE TO RELATED APPLICATION

This application is a division of U.S. application Ser. No. 17/199,371, filed on Mar. 11, 2021. The content of the application is incorporated herein by reference.

TECHNICAL FIELD

The present invention relates to the field of semiconductor technology, in particular to an electronic package structure and a manufacturing method thereof.

BACKGROUND

As is known in the art, semiconductor structures such as surface acoustic wave (SAW) components are often used as radio frequency (RF) and intermediate frequency (IF) filters in commercial applications to provide frequency selectivity and other electronic functions.

In the assembly process of electronic packaging, solder is usually used to attach bumps of semiconductor components to pads on a carrier. However, the conventional method would form a void under the semiconductor components. During the molding process, the molding compound would easily flow into the void, causing contamination of the bottom surface of the semiconductor components and affecting the surface circuits.

Therefore, in this technical field, there is still a need to provide an improved electronic package structure and a manufacturing method thereof to solve the above-mentioned problems and shortcomings in the prior art.

SUMMARY

It is one object of the present invention to provide an improved electronic package structure and manufacturing method thereof to solve the above-mentioned shortcomings and shortcomings of the prior art.

One aspect of the invention provides an electronic package structure, including: a substrate having an upper surface; a solder mask layer disposed on the upper surface of the substrate, wherein at least one outer side of the solder mask layer is aligned with at least one outer side of the substrate; an electronic component disposed on the upper surface of the substrate, wherein the electronic component has a first surface; and a cavity located between the electronic component and the solder mask layer, wherein a first surface of the cavity is formed by the first surface of the electronic component.

According to some embodiments, the electronic package structure further includes a molding compound covering the electronic component and at least a part of the solder mask layer.

According to some embodiments, the first surface of the electronic component is in direct contact with the solder mask layer.

According to some embodiments, a gap is provided between the first surface of the electronic component and the solder mask layer.

According to some embodiments, one side of the cavity is formed by the solder mask layer.

According to some embodiments, a second surface of the cavity is formed by at least a part of the upper surface of the substrate or formed by at least a part of the solder mask layer.

According to some embodiments, the solder mask layer includes a recessed area, and the cavity is provided in the recessed area, wherein the cavity is defined by the first surface of the electronic component, the solder mask layer and the upper surface of the substrate, and wherein a periphery of the electronic component overlaps with the solder mask layer surrounding the recessed area.

According to some embodiments, the at least one outer side of the substrate is not covered by the molding compound.

According to some embodiments, the at least one outer side of the solder mask layer is not covered by the molding compound.

According to some embodiments, the at least one outer side of the solder mask layer is aligned with at least one outer side of the molding compound.

According to some embodiments, the electronic component includes a surface acoustic wave filter, a semiconductor chip, a microelectromechanical system component, a high-frequency electronic component, or a radio frequency filter.

According to some embodiments, the solder mask layer includes a composite material, an adhesive material, or a multilayer film.

According to some embodiments, the electronic component further includes a surface circuit, and the surface circuit is provided on the first surface and is located in the cavity.

According to another aspect of the invention, a method of manufacturing an electronic package structure is disclosed. A substrate is provided. The substrate has an upper surface. A solder mask layer is formed on the upper surface of the substrate. A recessed area is formed in the solder mask layer. An electronic component is mounted on the substrate. The electronic component has a first surface. The upper surface of the substrate has a plurality of pads. The first surface of the electronic component has a plurality of bumps. The plurality of pads respectively corresponds to the plurality of bumps. The plurality of pads are electrically connected to the plurality of bumps. A heat treatment is performed to make the first surface close to the substrate and form a cavity in the recessed area. The cavity is between the first surface of the electronic component, the solder mask layer and the upper surface of the substrate.

According to some embodiments, the method further includes: forming a molding compound to cover the electronic component and at least a part of the solder mask layer.

According to some embodiments, the method further includes: performing a cutting process to make at least one outer side of the solder mask layer be aligned with at least one outer side of the substrate.

According to some embodiments, the electronic component further includes a surface circuit, and the surface circuit is provided on the first surface and located in the cavity.

According to some embodiments, the first surface of the electronic component is in direct contact with the solder mask layer after the heat treatment.

According to some embodiments, a gap is provided between the first surface of the electronic component and the solder mask layer after the heat treatment.

According to some embodiments, a periphery of the electronic component overlaps the solder mask layer surrounding the recessed area.

BRIEF DESCRIPTION OF THE DRAWINGS

FIG. 1 to FIG. 5 are schematic diagrams illustrating a method of forming an electronic package structure according to an embodiment of the present invention, wherein FIG. 2 illustrates a top view of a substrate after a recessed region is formed.

DETAILED DESCRIPTION

Figure 1:
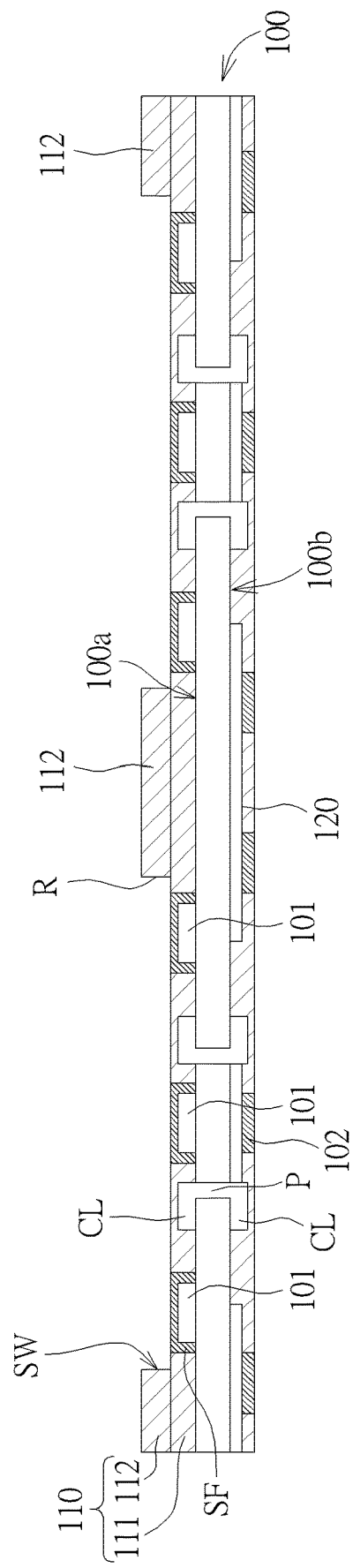

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The following detailed description is, therefore, not to be taken in a limiting sense, and the scope of the present invention is defined only by the appended claims, along with the full scope of equivalents to which such claims are entitled.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

The terms wafer and substrate used herein include any structure having an exposed surface onto which a material layer is deposited, for example, to form a circuit structure including, but not limited to, an interconnection metal line or a redistribution layer (RDL). The term substrate is understood to include wafers, but not limited thereto. The term substrate is also used to refer to semiconductor structures during processing, and may include other layers that have been fabricated thereupon.

The present disclosure pertains to an electronic package and a manufacturing method thereof. In the process of assembling the semiconductor structure, a solder mask layer is formed on a surface of a substrate. The solder mask layer may include a composite material, an adhesive material or a multilayer film, and a recessed area is formed in the solder mask layer, so that an electronic component could be installed within the recessed area, and a cavity is formed. The pollution problem of a bottom surface of the electronic component thus could be avoided, to ensure the performance of the electronic component.

Figure 8:
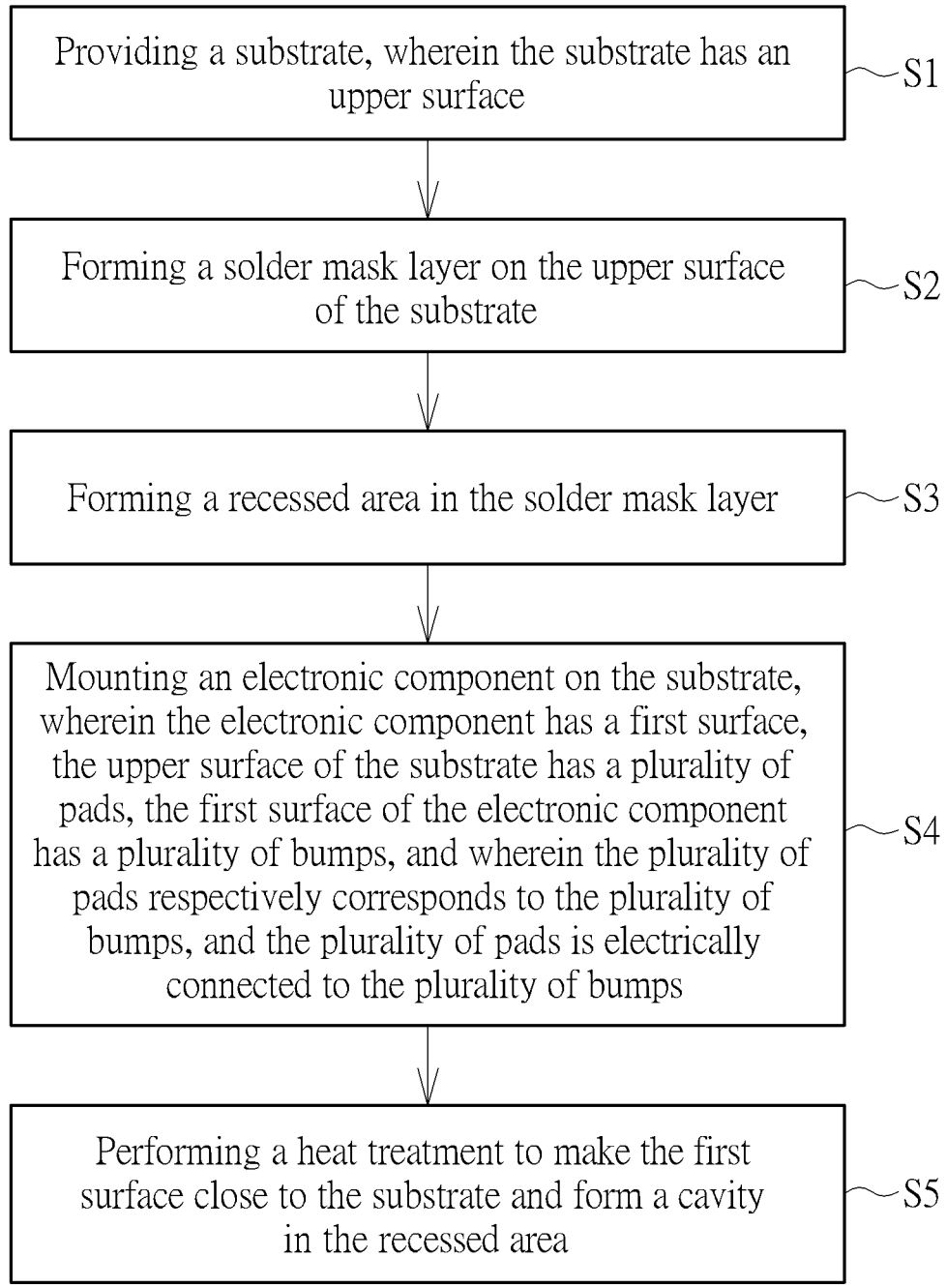
FIG. 8 is a flow chart of a method of manufacturing an electronic package structure according to the present invention.

Please refer to FIG. 1 to FIG. 5 in conjunction with FIG. 8. FIG. 1 to FIG. 5 are schematic diagrams illustrating a method of forming an electronic package structure 10 according to an embodiment of the present invention. FIG. 8 is a flow chart of a method for forming an electronic package structure according to the present invention. As shown in FIG. 1, Step S1 in FIG. 8 is first performed to provide a substrate 100. For example, the substrate 100 may be a package substrate or a printed circuit board, but is not limited to this. According to an embodiment of the present invention, the substrate 100 has an upper surface 100a and an opposite lower surface 100b. According to an embodiment of the present invention, Step S2 in FIG. 8 is then performed to form a solder mask layer 110 on the upper surface 100a of the substrate 100. According to an embodiment of the present invention, a solder mask layer 120 is further formed on the lower surface 100b of the substrate 100. According to an embodiment of the present invention, the solder mask layer 110 and the solder mask layer 120 may include a composite material, an adhesive material or a multilayer film.

According to an embodiment of the present invention, the solder mask layer 110 may have a thickness that is different from a thickness of the solder mask layer 120. For example, the thickness of the solder mask layer 110 could be greater than the thickness of the solder mask layer 120. For example, the thickness of the solder mask layer 110 may be about 15 to 35 micrometers. In some embodiments, the solder mask layer 110 and the solder mask layer 120 may be made of the same material or different materials according to design requirements. According to an embodiment of the present invention, the substrate 100 may further include at least one copper foil layer (or conductive layer) CL. According to an embodiment of the present invention, the substrate 100 may further include at least one conductive through hole P.

According to an embodiment of the present invention, the solder mask layer 110 may include a first layer 111 and a second layer 112. The first layer 111 directly covers the upper surface 100a of the substrate 100, and the second layer 112 covers the first layer 111. According to an embodiment of the present invention, the first layer 111 and the second layer 112 may be composed of the same material or different materials. According to an embodiment of the present invention, the first layer 111 may have a thickness that is different from a thickness of the second layer 112.

According to an embodiment of the present invention, a plurality of pads 101 may be formed on the upper surface 100a of the substrate 100. According to an embodiment of the present invention, a plurality of pads 102 may be formed on the lower surface 100b of the substrate 100. According to an embodiment of the present invention, a surface plating layer SF may be formed on each of the pads 101 and 102 to facilitate the subsequent soldering process. According to an embodiment of the present invention, the surface plating layer SF may be, for example, a nickel-gold layer, but is not limited thereto.

According to an embodiment of the present invention, the pads 101 and 102 may be electrically connected to the copper foil layer (or conductive layer) CL of the substrate 100. According to an embodiment of the present invention, the first layer 111 of the solder mask layer 110 does not cover the upper surfaces of the plurality of pads 101.

Figure 2:
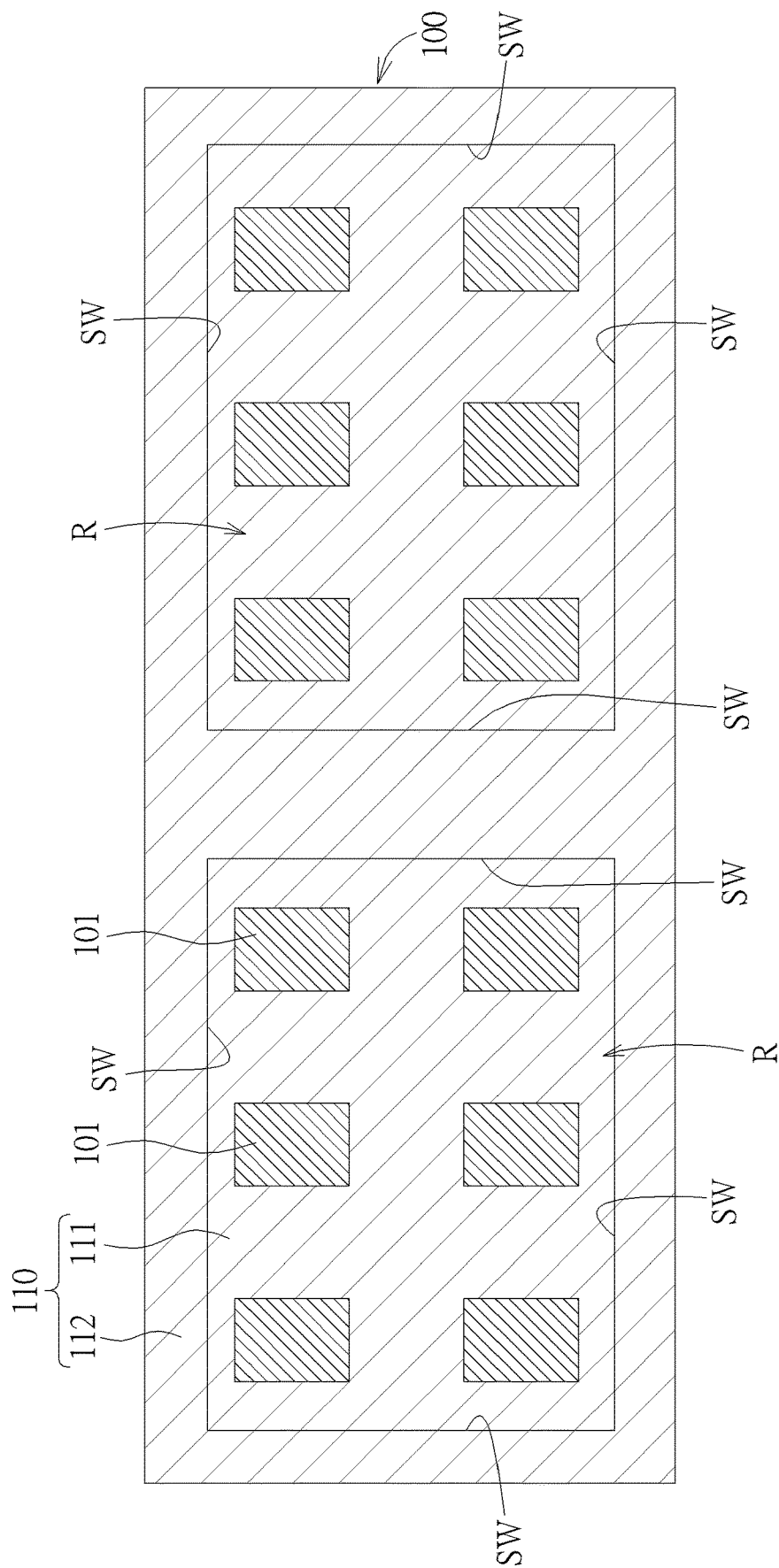

Subsequently, Step S3 in FIG. 8 is performed to form a recessed area R in the second layer 112 of the solder mask layer 110, thereby exposing the upper surfaces of the plurality of pads 101. According to an embodiment of the present invention, an exposure and development process and/or an etching process may be used to form the recessed region R in the second layer 112 of the solder mask layer 110, but it is not limited thereto. FIG. 2 illustrates a top view of the substrate 100 after the recessed region R is formed according to an embodiment of the present invention. As shown in FIG. 2, the recessed area R may be an area defined by the four sidewalls SW of the second layer 112 of the solder mask layer 110, wherein the area could be a rectangular area, but is not limited thereto. As shown in FIG. 2, the upper surfaces of the plurality of pads 101 are exposed in the recessed area R.

Figure 3:
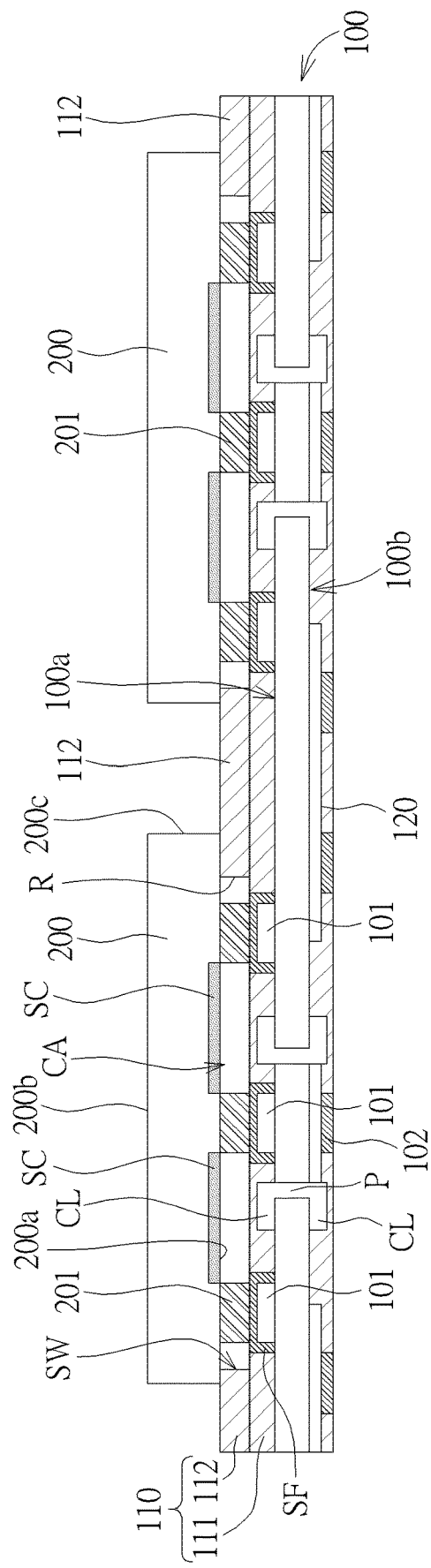

As shown in FIG. 3, Step S4 in FIG. 8 is then performed to mount an electronic component 200 on the substrate 100. According to an embodiment of the present invention, the electronic component 200 may be an integrated circuit chip, for example, a surface acoustic wave (SAW) component, but is not limited thereto. For example, the electronic component 200 may include a surface acoustic wave filter, a semiconductor chip, a microelectromechanical system (MEMS) component, a high-frequency electronic component, or a radio frequency filter. The electronic component 200 has a first surface 200a, a second surface 200b opposite to the first surface 200a, and a side wall 200c between the first surface 200a and the second surface 200b. According to an embodiment of the present invention, the periphery of the electronic component 200 overlaps with the solder mask layer 110 surrounding the recessed area R.

According to an embodiment of the present invention, a plurality of bumps 201 would be formed on the first surface 200a of the electronic component 200. According to an embodiment of the present invention, the thickness of the plurality of bumps 201 is about 50 micrometers. According to an embodiment of the present invention, for example, the plurality of bumps 201 may include, for example, copper, gold, nickel, tin, or any combination thereof, but is not limited thereto. In addition, at least one surface circuit SC, for example, a finger electrode, is further formed on the first surface 200a of the electronic component 200.

According to an embodiment of the present invention, when the electronic component 200 is mounted, the plurality of bumps 201 of the electronic component 200 may respectively correspond to the plurality of pads 101 of the substrate 100, so that the plurality of pads 101 may be electrically connected to the plurality of bumps 201. Subsequently, Step S5 in FIG. 8 is performed to proceed a heat treatment. According to an embodiment of the present invention, generally, the above-mentioned electrical connection could be formed through a heat treatment such as a reflow process. According to an embodiment of the present invention, after the aforementioned heat treatment, for example, the thickness of the plurality of bumps 201 could be reduced from the original 50 micrometers to about 15 to 35 micrometers, so that the first surface 200a of the electronic component 200 is further closer to the substrate 100, and a cavity CA hence is formed in the recessed area R. The cavity CA is between the first surface 200a of the electronic component 200, the solder mask layer 110, and the upper surface 100a of the substrate 100.

According to an embodiment of the present invention, after the above heat treatment is completed, the first surface 200a of the electronic component 200 may directly contact the upper surface of the second layer 112 of the solder mask layer 110 around the recessed area R. Therefore, in this example, the cavity CA may be a sealed space.

Figure 6:
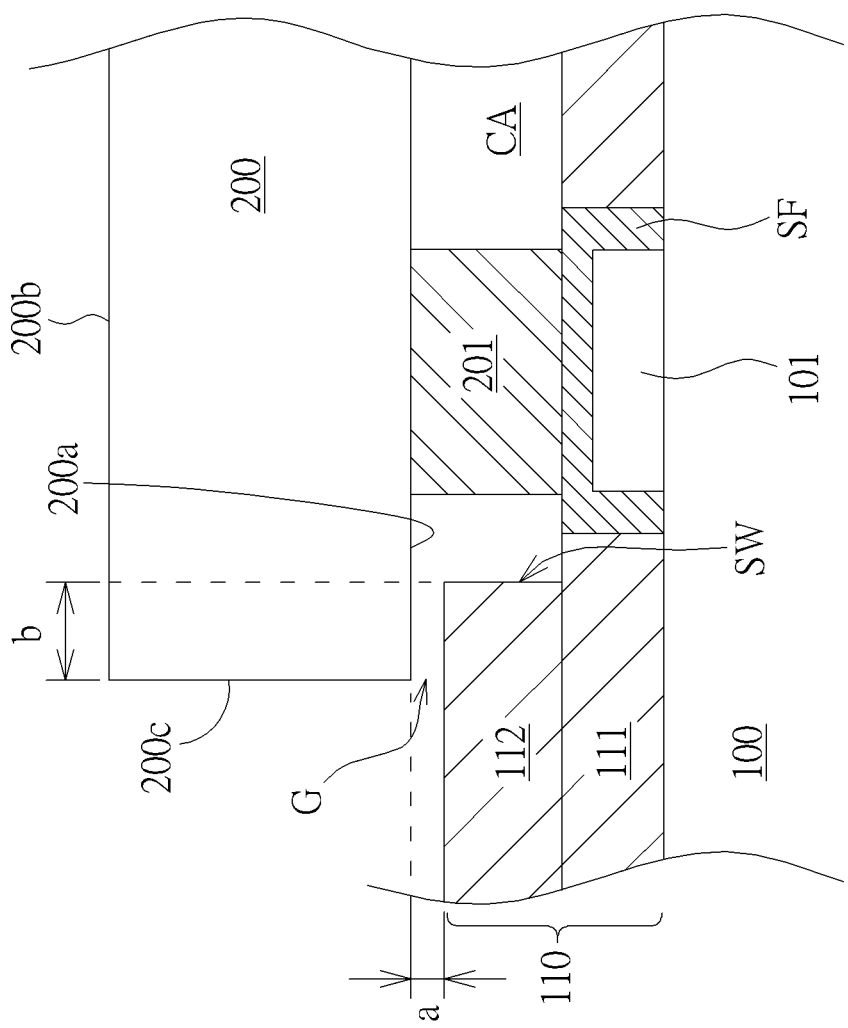
FIG. 6 is a partial enlarged view illustrating that a first surface of the electronic component does not directly contact a solder mask layer around the recessed area and that a gap is formed between the electronic component and the solder mask layer.

According to another embodiment of the present invention, as shown in FIG. 6, the first surface 200a of the electronic component 200 may not directly contact the upper surface of the second layer 112 of the solder mask layer 110 around the recessed area R, and, there is a gap G between the first surface 200a of the electronic component 200 and the upper surface of the second layer 112. According to another embodiment of the present invention, for example, a ratio of the gap G (that is, the ratio of the height a to the width b shown in FIG. 6) is about 1:2. For example, the height a of the gap G may be about 2.5 micrometers, and the width b may be about 5 micrometers, but is not limited thereto. In addition, in order to prevent a molding compound from penetrating into the cavity CA and contaminating the surface circuit SC on the first surface 200a of the electronic component 200, in some embodiments, the height a of the gap G is less than 5 micrometers.

Figure 4:
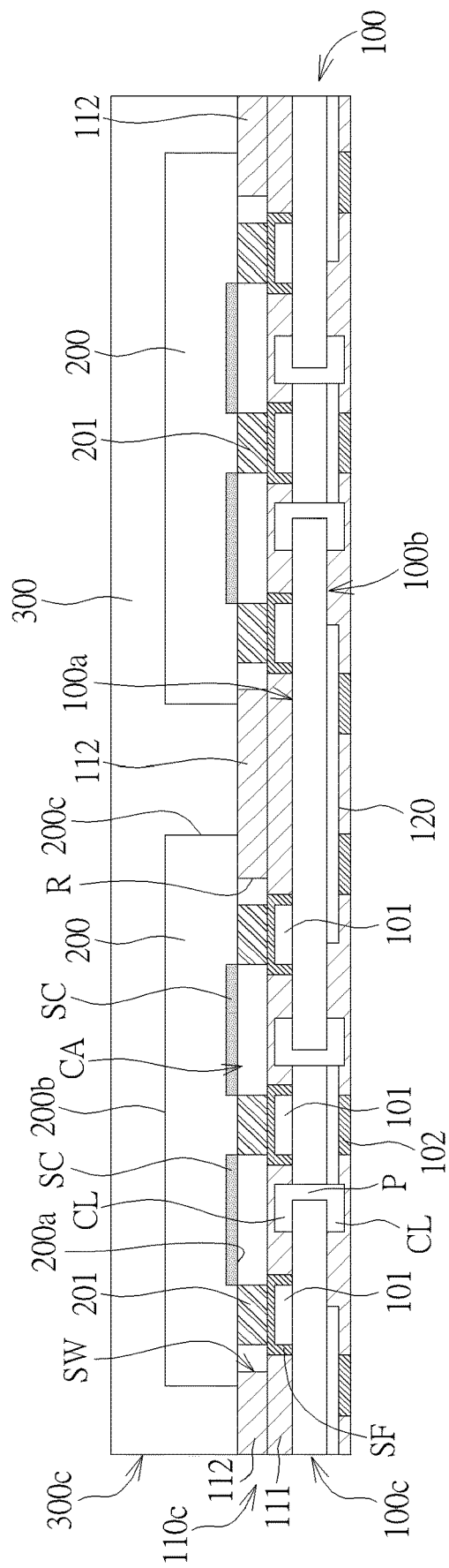

As shown in FIG. 4, a molding compound 300 is then formed on the substrate 100 to cover the electronic component 200 and at least a part of the solder mask layer 110. For example, the molding compound 300 may be formed on the substrate 100 by means of transfer molding or compression molding. According to another embodiment of the present invention, the molding compound 300 may include a resin, but it is not limited thereto. Since the surface circuit SC on the first surface 200a of the electronic component 200 is located in the cavity CA, it can be ensured that the molding compound 300 will not contaminate the surface circuit SC on the first surface 200a of the electronic component 200, so the performance and operations of the electronic component 200 could be maintained.

Figure 5:
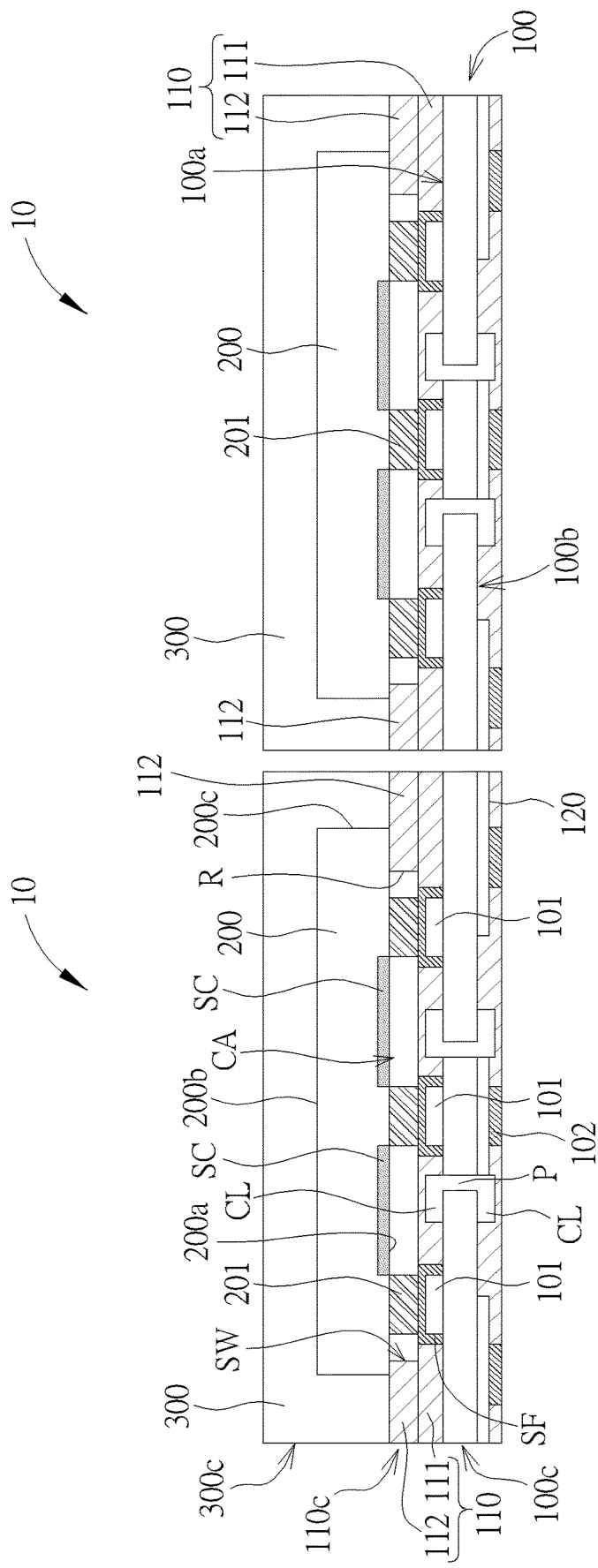

As shown in FIG. 5, a cutting process is then performed to form a separate electronic package structure 10. According to an embodiment of the present invention, at least one outer side 110c of the solder mask layer 110 is aligned with at least one outer side 100c of the substrate 100.

Structurally, as shown in FIG. 5, the electronic package structure 10 of the present invention includes: a substrate 100 having an upper surface 100a; and a solder mask layer 110 disposed on the upper surface 100a of the substrate 100. At least one outer side 110c of the solder mask layer 110 is aligned with at least one outer side 100c of the substrate 100. An electronic component 200 is disposed on the upper surface 100a of the substrate 100. The electronic component 200 has a first surface 200a. A cavity CA is located between the electronic component 200 and the solder mask layer 110.

According to an embodiment of the present invention, the electronic package structure 10 of the present invention further includes a molding compound 300 covering the electronic component 200 and at least a part of the solder mask layer 110.

According to an embodiment of the present invention, the first surface 200a of the electronic component 200 is in direct contact with the solder mask layer 110. According to another embodiment of the present invention, as shown in FIG. 6, there is a gap G between the first surface 200a of the electronic component 200 and the solder mask layer 110. In order to prevent the molding compound from penetrating into the cavity CA and contaminating the surface circuit SC on the first surface 200a of the electronic component 200, in some embodiments, the height a of the gap G is less than 5 micrometers.

According to an embodiment of the present invention, a first surface of the cavity CA is formed by the first surface 200a of the electronic component 200. According to an embodiment of the present invention, one side of the cavity CA is formed by the solder mask layer 110. According to an embodiment of the present invention, a second surface of the cavity CA is formed by at least a part of the solder mask layer 110. According to an embodiment of the present invention, the height of the cavity CA may be between 15 and 35 micrometers.

According to an embodiment of the present invention, the solder mask layer 110 includes a recessed area R, and the cavity CA is provided in the recessed area R. The cavity CA is defined by the first surface 200a of the electronic component 200, the solder mask layer 110, and the upper surface 100a of the substrate 100. And, the periphery of the electronic component 200 overlaps the solder mask layer 110 surrounding the recessed area R.

According to an embodiment of the present invention, the at least one outer side 100c of the substrate 100 is not covered by the molding compound 300. According to an embodiment of the present invention, the at least one outer side 110c of the solder mask layer 110 is not covered by the molding compound 300.

According to an embodiment of the present invention, the at least one outer side 110c of the solder mask layer 110 is aligned with at least one outer side 300c of the molding compound 300.

According to an embodiment of the present invention, the electronic component 200 includes a surface acoustic wave filter, a semiconductor chip, a MEMS component, a high-frequency electronic component, or a radio frequency filter.

According to an embodiment of the present invention, the solder mask 110 may include a composite material, an adhesive material, or a multilayer film.

According to an embodiment of the present invention, the electronic component 200 may further include a surface circuit SC, and the surface circuit SC is disposed on the first surface 200a and is located in the cavity CA.

According to an embodiment of the present invention, the electronic package structure 10 further includes: a plurality of pads 101 disposed on the upper surface 100a of the substrate 100; and a plurality of bumps 201 disposed on the first surface 200a of the electronic component 200. The pads 101 may correspond to the bumps 201, respectively. According to an embodiment of the present invention, the plurality of pads 101 is electrically connected to the plurality of bumps 201.

Figure 7:
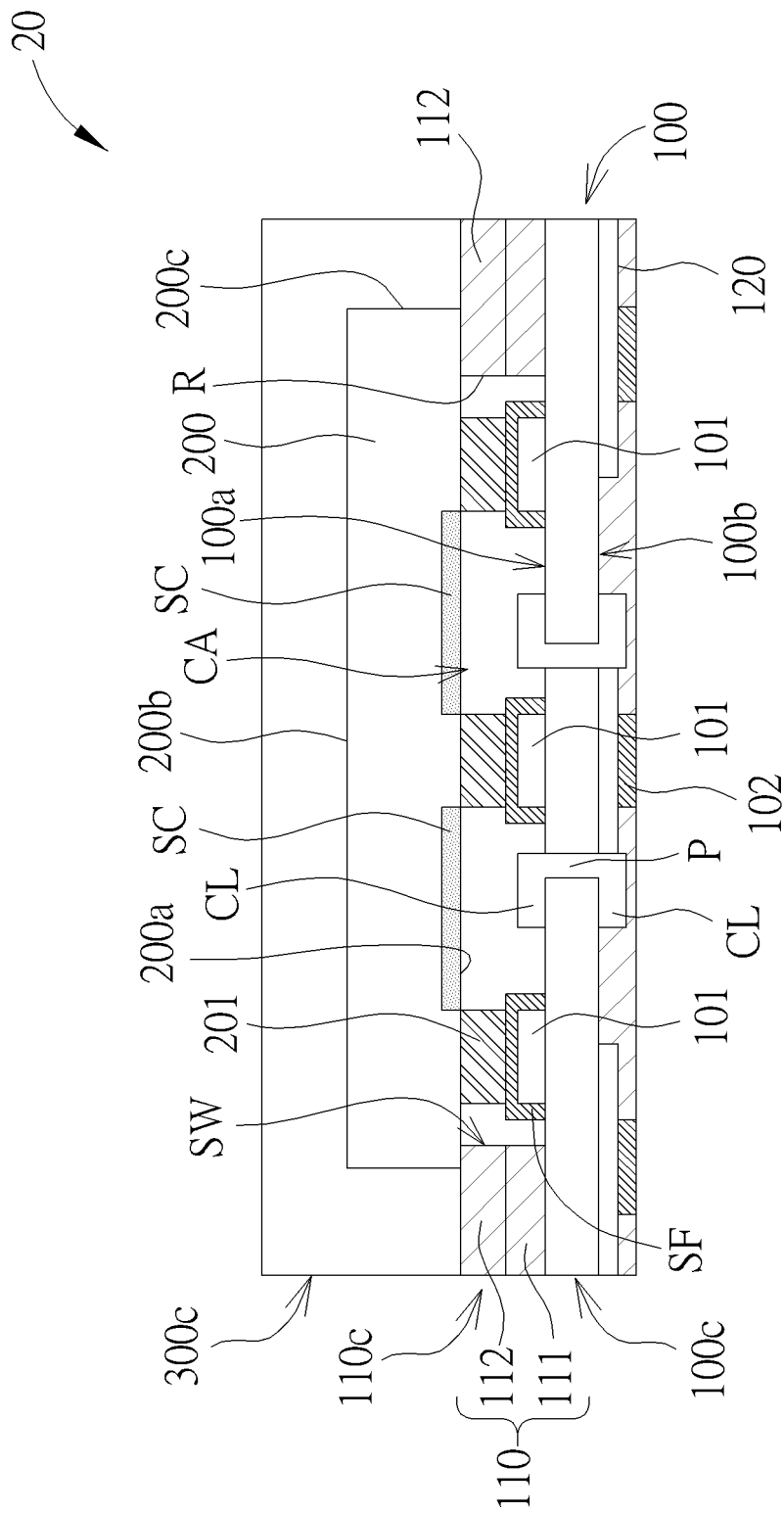
FIG. 7 is a schematic cross-sectional view of an electronic package structure according to another embodiment of the present invention.

FIG. 7 is a schematic cross-sectional view of an electronic package structure 20 according to another embodiment of the present invention. As shown in FIG. 7, according to another embodiment of the present invention, a second surface of the cavity CA may be formed by at least a part of the upper surface 100a of the substrate 100. In this embodiment, the first layer 111 of the solder mask 110 may be formed on the substrate 100 first, and then the first layer 111 under the electronic component 200 may be removed by an exposure and development process to form a temporary recessed area, revealing the pads 101 and part of the upper surface 100a of the substrate 100. Subsequently, the second layer 112 of the solder mask layer 110 is formed. The second layer 112 covers the first layer 111 of the solder mask layer 110 and fills the aforementioned temporary recessed area formed by the first layer 111 of the solder mask layer 110. Then, an exposure and development process and/or an etching process may be performed to form a recessed region R in the second layer 112 of the solder mask layer 110. The range of the recessed region R may be approximately equal to the range of the aforementioned temporary recessed region. Then, the steps described in FIGS. 3 to 5 are performed to complete the manufacture of the electronic package structure 20.

One advantage of the present invention is that during the assembly process of the semiconductor structure, a solder mask layer is formed on the surface of the substrate and a recessed area is formed in the solder mask layer, so that the electronic component is correspondingly mounted on the recessed area to form a cavity. By applying the method/package structure of the present invention, the pollution problem of the bottom surface of the semiconductor component could be avoided. The manufacturing and molding of the present invention can be easier and the cost is lower. In addition, the compatibility of the present invention is high, and the bonding of the solder mask layer is good. The structure of the present invention has improved strength and therefore the stress problem can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an electronic package structure, comprising:
   providing a substrate, wherein the substrate has an upper surface;
   forming a solder mask layer on the upper surface of the substrate;
   forming a recessed area in the solder mask layer, wherein the solder mask layer comprises a first layer disposed on the upper surface of the substrate and a second layer disposed on the first layer;
   mounting an electronic component on the substrate, wherein the electronic component has a first surface, the upper surface of the substrate has a plurality of pads, the first surface of the electronic component has a plurality of bumps, and wherein the plurality of pads respectively corresponds to the plurality of bumps, and the plurality of pads are electrically connected to the plurality of bumps; and
   performing a heat treatment, to make the first surface close to the substrate and form a cavity in the recessed area, wherein the cavity is between the first surface of the electronic component, the first layer of the solder mask layer, and the upper surface of the substrate, wherein the second layer of the solder mask layer has an inner side, which defines span of the cavity, and an outer side, which is flush with at least one outer side of the substrate, wherein the second layer of the solder mask layer is continuous layer from the inner side to the outer side.

2. The method according to claim 1 further comprising:
   forming a molding compound to cover the electronic component and at least a part of the solder mask layer.

3. The method according to claim 1 further comprising:
   performing a cutting process to make at least one outer side of the solder mask layer be aligned with at least one outer side of the substrate.

4. The method according to claim 1, wherein the electronic component further comprises a surface circuit, and the surface circuit is provided on the first surface and is located in the cavity.

5. The method according to claim 1, wherein the first surface of the electronic component is in direct contact with the solder mask layer after the heat treatment.

6. The method according to claim 1, wherein a gap is provided between the first surface of the electronic component and the solder mask layer after the heat treatment.

7. The method according to claim 1, wherein a periphery of the electronic component overlaps the solder mask layer surrounding the recessed area.

* * * * *